(12) United States Patent
Ohkubo

(10) Patent No.: US 10,347,671 B2
(45) Date of Patent: Jul. 9, 2019

(54) IMAGE SENSOR AND ELECTRONIC DEVICE

(71) Applicant: SONY SEMICONDUCTOR SOLUTIONS CORPORATION, Kanagawa (JP)

(72) Inventor: Tomohiro Ohkubo, Kumamoto (JP)

(73) Assignee: Sony Semiconductor Solution Corporation, Kanagawa (JP)

( * ) Notice: Subject to any disclaimer, the term of this patent is extended or adjusted under 35 U.S.C. 154(b) by 559 days.

(21) Appl. No.: 14/179,964

(22) Filed: Feb. 13, 2014

(65) Prior Publication Data

US 2014/0239155 A1   Aug. 28, 2014

(30) Foreign Application Priority Data

Feb. 22, 2013 (JP) ................................ 2013-033493

(51) Int. Cl.
*H01L 27/146* (2006.01)

(52) U.S. Cl.
CPC .... *H01L 27/14603* (2013.01); *H01L 27/1461* (2013.01); *H01L 27/14623* (2013.01)

(58) Field of Classification Search
CPC ........... H01L 27/14603; H01L 27/1461; H01L 27/14623; H01L 27/14601; H01L 27/14605; H01L 27/14607; H01L 27/1462
USPC .............. 250/208.1, 214 R, 214.1, 216, 229, 250/237 R, 239; 257/431, 432, 434, 435, 257/443; 348/276, 272
See application file for complete search history.

(56) References Cited

U.S. PATENT DOCUMENTS

| | | | | |
|---|---|---|---|---|
| 6,344,666 B1* | 2/2002 | Yamaguchi | ....... | H01L 27/14609 257/213 |
| 6,995,800 B2* | 2/2006 | Takahashi | ............ | H04N 5/2254 257/294 |
| 7,417,273 B2* | 8/2008 | Inoue | ................ | H01L 27/14603 257/291 |
| 7,906,827 B2* | 3/2011 | Katsuno | ............ | H01L 27/14603 250/226 |
| 8,106,343 B2* | 1/2012 | Arishima | .......... | H01L 27/14623 250/208.1 |
| 2005/0062863 A1* | 3/2005 | Takeuchi | .......... | H01L 27/14621 348/272 |
| 2009/0008687 A1* | 1/2009 | Katsuno | ............ | H01L 27/14636 257/292 |
| 2011/0139968 A1* | 6/2011 | Cheung | ..................... | G01J 1/06 250/216 |

(Continued)

FOREIGN PATENT DOCUMENTS

JP   2008-103647 A   5/2008

*Primary Examiner* — Que Tan Le
*Assistant Examiner* — Jennifer D Bennett
(74) *Attorney, Agent, or Firm* — Sheridan Ross P.C.

(57) ABSTRACT

An image sensor includes a plurality of unit pixels formed as a semiconductor chip, each of which has a photoelectric converting unit, a charge holding unit that holds charges stored in the photoelectric converting unit, a charge-voltage converting unit that converts a charge transferred from the charge holding unit to a voltage, and light shielding films between which an opening is formed above the photoelectric converting unit. The plurality of unit pixels are placed in a matrix in a pixel array. The shapes of the light shielding films are varied depending on the position of the unit pixel in the pixel array.

7 Claims, 12 Drawing Sheets

(56) References Cited

U.S. PATENT DOCUMENTS

2011/0234836 A1\* 9/2011 Machida .......... H01L 27/14603
348/222.1

\* cited by examiner

IMAGE SENSOR AND ELECTRONIC DEVICE

CROSS REFERENCE TO RELATED APPLICATIONS

This application claims the benefit of Japanese Priority Patent Application JP 2013-033493 filed Feb. 22, 2013, the entire contents of which are incorporated herein by reference.

BACKGROUND

The present disclosure relates to an image sensor and an electronic device, and more particularly to an image sensor and electronic device that can reduce noise generation.

Recently, complementary metal-oxide-semiconductor (CMOS) image sensors are widely used as imaging devices. In general, however, pixels in the CMOS image sensor are sequentially read one at a time, so it is difficult to obtain simultaneity for an entire image.

That is, in the CMOS image sensor, photocharges created by a photoelectric converting unit and stored therein are sequentially scanned and read one pixel or one line of pixels at a time. When this sequential scanning is performed, that is, a rolling shutter is used as an electronic shutter, it is difficult to start an exposure, during which photocharges are stored, for all pixels at the same time and to terminate the disclosure for all pixels at the same time. Accordingly, sequential scanning is problematic in that a captured image of a moving subject is distorted.

In sensing applications in which this type of image distortion is not allowed, such as when a subject moving at high speed is captured or simultaneity is desirable for a captured image, a global shutter is used that starts an exposure for all pixels in a pixel array at the same time and terminates the exposure for all pixels at the same time.

An image sensor that uses a global shutter as an electronic shutter includes a charge storage unit formed with, for example, a semiconductor memory in each pixel. In this type of image sensor, charges are simultaneously transferred from a photodiode to the semiconductor memory and are stored therein, after which the stored charges are sequentially read to obtain simultaneity for an entire image (see Japanese Unexamined Patent Application Publication No. 2008-103647, for example).

SUMMARY

A problem with this type of image sensor that uses a global shutter is that noise is generated by light that has entered an area to hold charges in a pixel. If, for example, light intended to be received in a light receiving area in a pixel leaks to the charge storage unit, optical noise is generated.

To suppress this type of noise, the memory is shielded from light with, for example, wire layers and light shielding films. Since the charge storage unit is adjacent to the photodiode, however, it is difficult to completely suppress optical noise.

That is, even if the memory is shield from light with wire layers and light shielding films, the angle of the main light rays of incident light varies in each area in the pixel array, so the shielding capability is superior or inferior depending on the area in the pixel array.

A technology in related art that adjusts the amount of light at a corner of an image is to correct the layout of wire layers, a color filter, an on-chip lens, and the like.

In the technology in related art, however, although the amount of light that enters the photodiode can be reduced because wire layers are provided for the photodiode and pupil correction is performed for the photodiode, it is difficult to suppress an increase in the amount of light that enters the charge holding area.

It is desirable to reduce noise reduction.

According to an embodiment of the present technology, there is provided an image sensor that includes a plurality of unit pixels formed as a semiconductor chip, each of which has a photoelectric converting unit, a charge holding unit that holds charges stored in the photoelectric converting unit, a charge-voltage converting unit that converts a charge transferred from the charge holding unit to a voltage, and light shielding films between which an opening is formed above the photoelectric converting unit; the plurality of unit pixels are placed in a matrix in a pixel array; the shapes of the light shielding films are varied depending on the position of the unit pixel in the pixel array.

At each position of the unit pixel in the pixel array, it is possible to determine the shapes of the light shielding films according to the direction in which the main light rays of light incident on the photoelectric converting unit are directed.

It is possible to vary the position of the opening formed between the light shielding films depending on the position of the unit pixel in the pixel array.

It is possible to use wires of the semiconductor chip instead of the light shielding films.

It is possible to further vary the size of the opening formed between the light shielding films depending on the position of the unit pixel in the pixel array.

It is possible to vary the shapes of the wires of the semiconductor chip depending on the position of the unit pixel in the pixel array.

At each position of the unit pixel in the pixel array, it is possible to determine the shapes of the light shielding films and the shapes of the wires of the semiconductor chip according to the direction in which the main light rays of light incident on the photoelectric converting unit are directed and to further vary a position at which the on-chip lens of the unit pixel is placed depending on the direction of the main light rays.

In the embodiment and a second embodiment of the of the present technology, a plurality of unit pixels formed as a semiconductor chip are provided; the plurality of unit pixels are placed in a matrix in a pixel array; the shapes of the light shielding films are varied depending on the position of the unit pixel in the pixel array.

According to the present technology, noise generation can be reduced.

DETAILED DESCRIPTION OF EMBODIMENTS

An embodiment of the technology disclosed here will be described with reference to the drawings.

Figure 1:
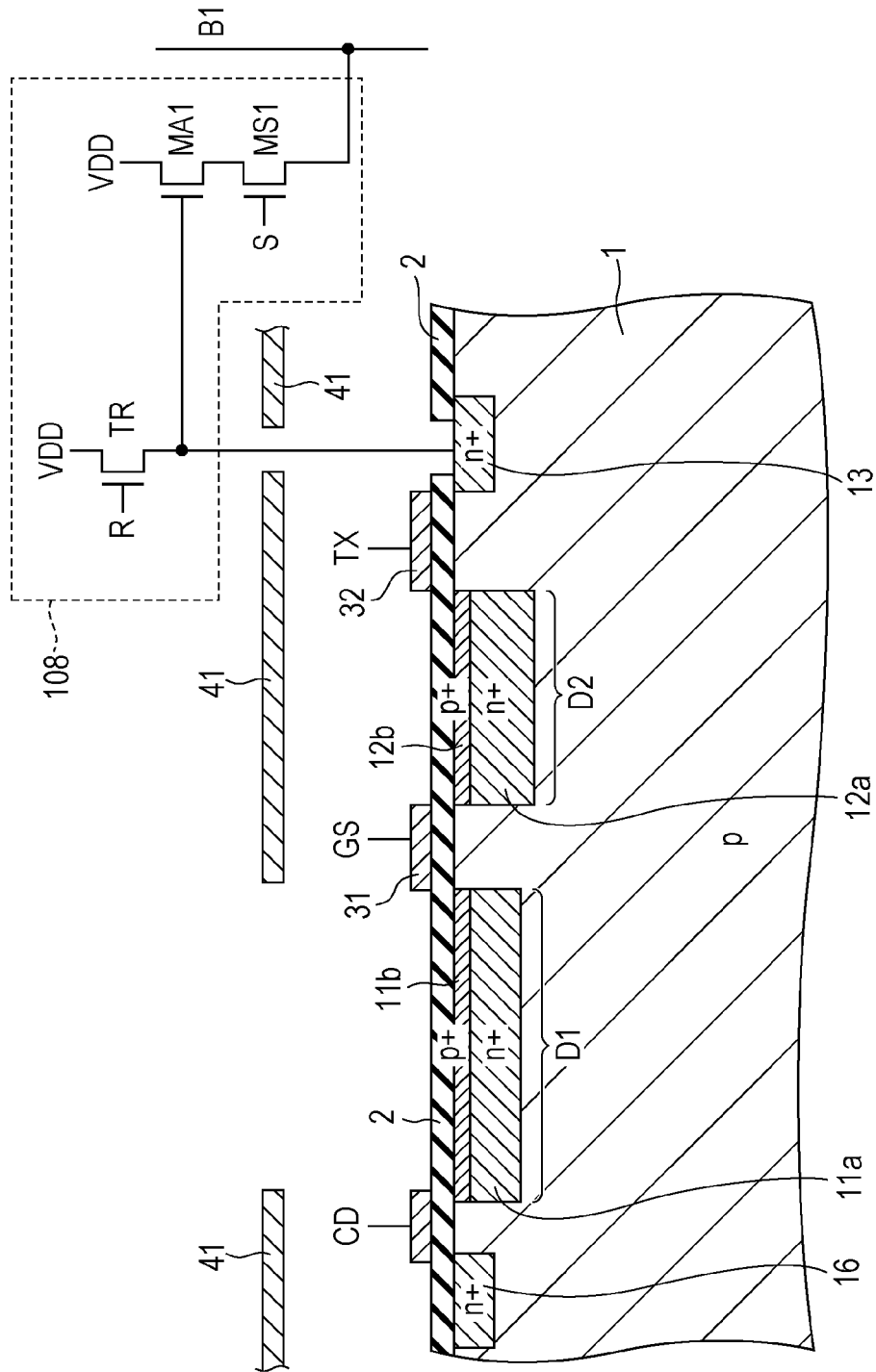
FIG. 1 illustrates an example of the structure of a pixel in a CMOS image sensor that uses a global shutter.

FIG. 1 illustrates an example of the structure of a pixel in a CMOS image sensor that uses a global shutter. FIG. 1 is a cross sectional view of a semiconductor device that forms a pixel in a CMOS image sensor.

As illustrated in FIG. 1, the semiconductor device includes a semiconductor substrate 1 of a first conductive type (p type) and a light-receiving surface-embedded area 11a (light receiving cathode area) of a second conductive type (n type), which is embedded in part of the top of the semiconductor substrate 1 and on which light is incident. A charge storage area 12a of the second conductive type (n+ type) is also embedded in part of the top of the semiconductor substrate 1 so as to be away from the light receiving cathode area 11a. The charge storage area 12a, which has a higher impurity density than the light receiving cathode area 11a, stores signal charges created in the light receiving cathode area 11a. A charge read area 13 is also provided that accepts signal charges stored in the charge storage area 12a.

The light receiving cathode area 11a and the semiconductor substrate (anode area) 1 immediately below the light receiving cathode area 11a constitute a photodiode D1. The charge storage area (cathode area) 12a and the semiconductor substrate (anode area) 1 immediately below the charge storage area 12a constitute a charge storage photodiode D2.

A p+-type pinning layer 11b is placed on the light receiving cathode area 11a. A p+-type pinning layer 12b is placed on the charge storage area 12a. The p+-type pinning layer 11b and p+-type pinning layer 12b are each a layer that suppresses carriers from being created on the surface in the dark. They are preferably used to reduce dark current. If dark current is not problematic, the p+-type pinning layer 11b and p+-type pinning layer 12b may be eliminated to simplify the structure.

An insulating layer 2 is formed on the p+-type pinning layer 11b and p+-type pinning layer 12b, on the semiconductor substrate 1 between the p+-type pinning layer 11b and the p+-type pinning layer 12b, and on the semiconductor substrate 1 between the light receiving cathode area 11a and the charge read area 13. Although a silicon dioxide film ($SiO_2$ film) is preferable as the insulating layer 2, an insulating gate structure with an insulating gate type of transistor (metal insulator semiconductor (MIS) transistor) that uses any one of various insulating films other than a silicon dioxide film ($SiO_2$ film) may be used. For example, an ONO film formed by stacking three layers, silicon dioxide film ($SiO_2$ film), silicon nitride film ($Si_3N_4$ film) and silicon dioxide film ($SiO_2$ film) may be used. Alternatively, an oxide including at least one element of strontium (Sr), aluminum (Al), magnesium (Mg), yttrium (Y), hafnium (Hf), zirconium (Zr), tantalum (Ta), and bismuth (Bi), a silicon nitride including at least one of these elements, or the like can be used as the insulating layer 2.

On the insulating layer 2, a transfer gate electrode 31 is placed that controls the electric potential of a first transfer channel formed between the light receiving cathode area 11a and the charge storage area 12a and transfers a signal charge from the light receiving cathode area 11a to the charge storage area 12a. In addition, on the insulating layer 2, a read gate electrode 32 is placed that controls the electric potential of a second transfer channel formed between the charge storage area 12a and the charge read area 13 and transfers a signal charge from the charge storage area 12a to the charge read area 13.

The gate electrode of a signal read transistor (amplifier transistor) MA1, which is part of a read buffer amplifier 108, is connected to the charge read area 13. The drain electrode of the signal read transistor MA1 is connected to a power supply unit VDD, and its source electrode is connected to the drain electrode of a switching transistor MS1 configured to select a pixel.

The source electrode of the switching transistor MS1, which selects a pixel, is connected a vertical signal line B1, and its gate electrode receives a horizontal line selection control signal S. When the selection control signal S goes high (H), the switching transistor MS1 is electrically connected, causing a current corresponding to the electric potential, amplified by the signal read transistor (amplifier transistor) MA1, in the charge read area 13 to flow to the vertical signal line B1.

The source electrode of a reset transistor TR, which is part of the read buffer amplifier 108, is connected to the charge read area 13. The drain electrode of the reset transistor TR is connected to a power supply unit VDD, and its gate electrode receives a reset signal R. When the reset signal R goes high (H), the signal charges stored in the light receiving cathode area 11a and charge storage area 12a are discharged, resetting the light receiving cathode area 11a and charge storage area 12a.

Figure 2:
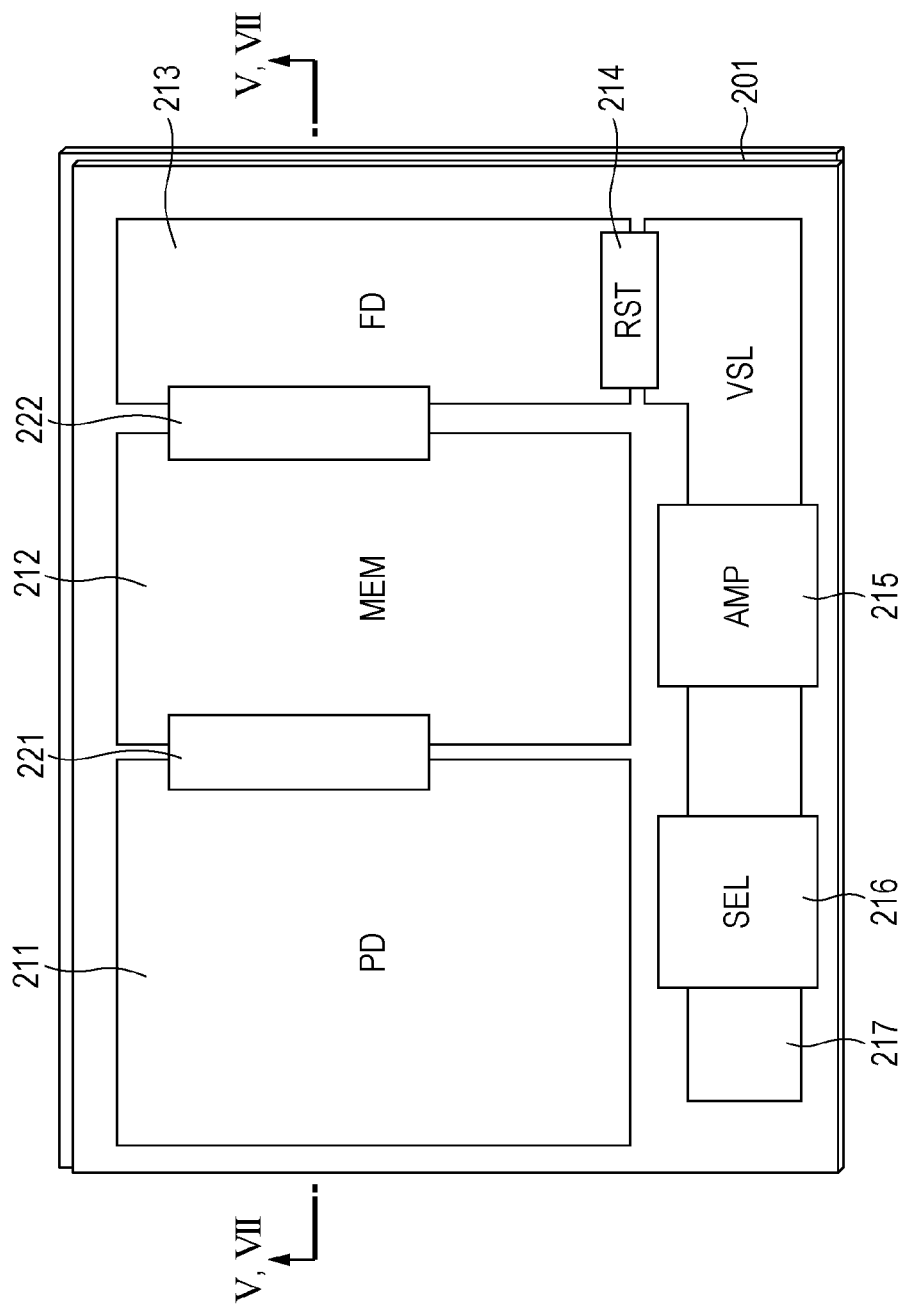
FIG. 2 illustrates an example of the layout, on a semiconductor substrate, of a pixel in a CMOS image sensor that uses a global shutter.

FIG. 2 illustrates an example of the layout, on a semiconductor substrate, of a pixel in a CMOS image sensor that uses a global shutter. In FIG. 2, a photodiode (PD) 211 and a memory (MEM) 212 are provided in an area 201 on a semiconductor substrate that forms one pixel. The memory 212 corresponds to the charge storage area 12a described above. The photodiode 211 and memory 212 are interconnected through a transfer transistor 221.

A floating diffusion (FD) 213 is provided in the area 201 on the semiconductor substrate. The floating diffusion 213 corresponds to the charge read area 13 described above. The memory 212 and floating diffusion 213 are interconnected through a transfer transistor 222.

In addition, a vertical signal line 217 is provided in the area 201 on the semiconductor substrate. The vertical signal line 217 is connected to prescribed terminals of a selection transistor (SEL) 216, an amplifier transistor (AMP) 215, and a reset transistor (RST) 214.

Figure 3:
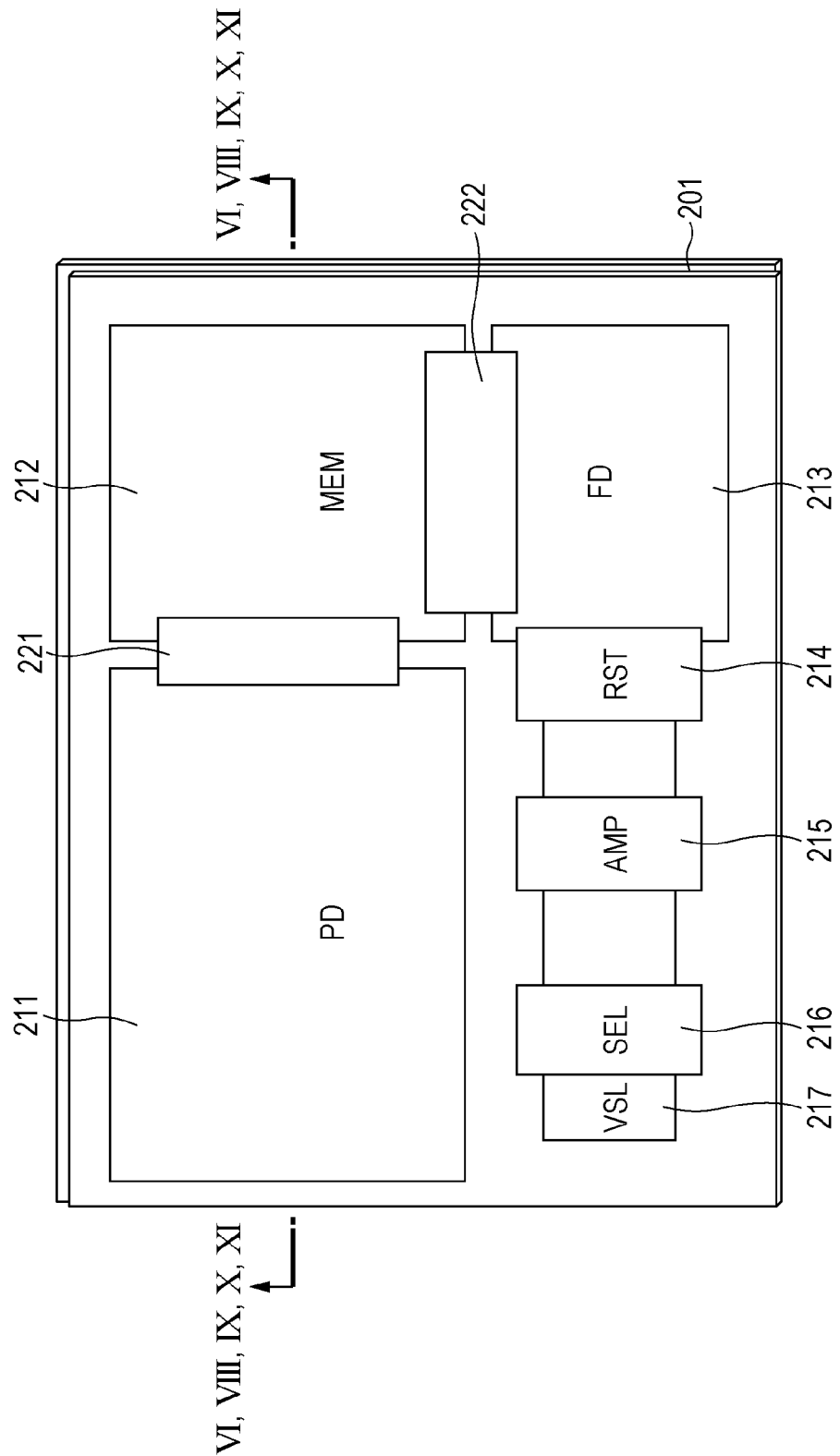
FIG. 3 illustrates another example of the layout of a pixel on a semiconductor substrate.

FIG. 3 illustrates another example of the layout of a pixel on a semiconductor substrate. The layout in FIG. 3 differs from the layout in FIG. 2 in that the floating diffusion 213 is disposed below the memory 212 on the drawing sheet.

Other structures in FIG. 3 are the same as in FIG. 2.

Figure 4:
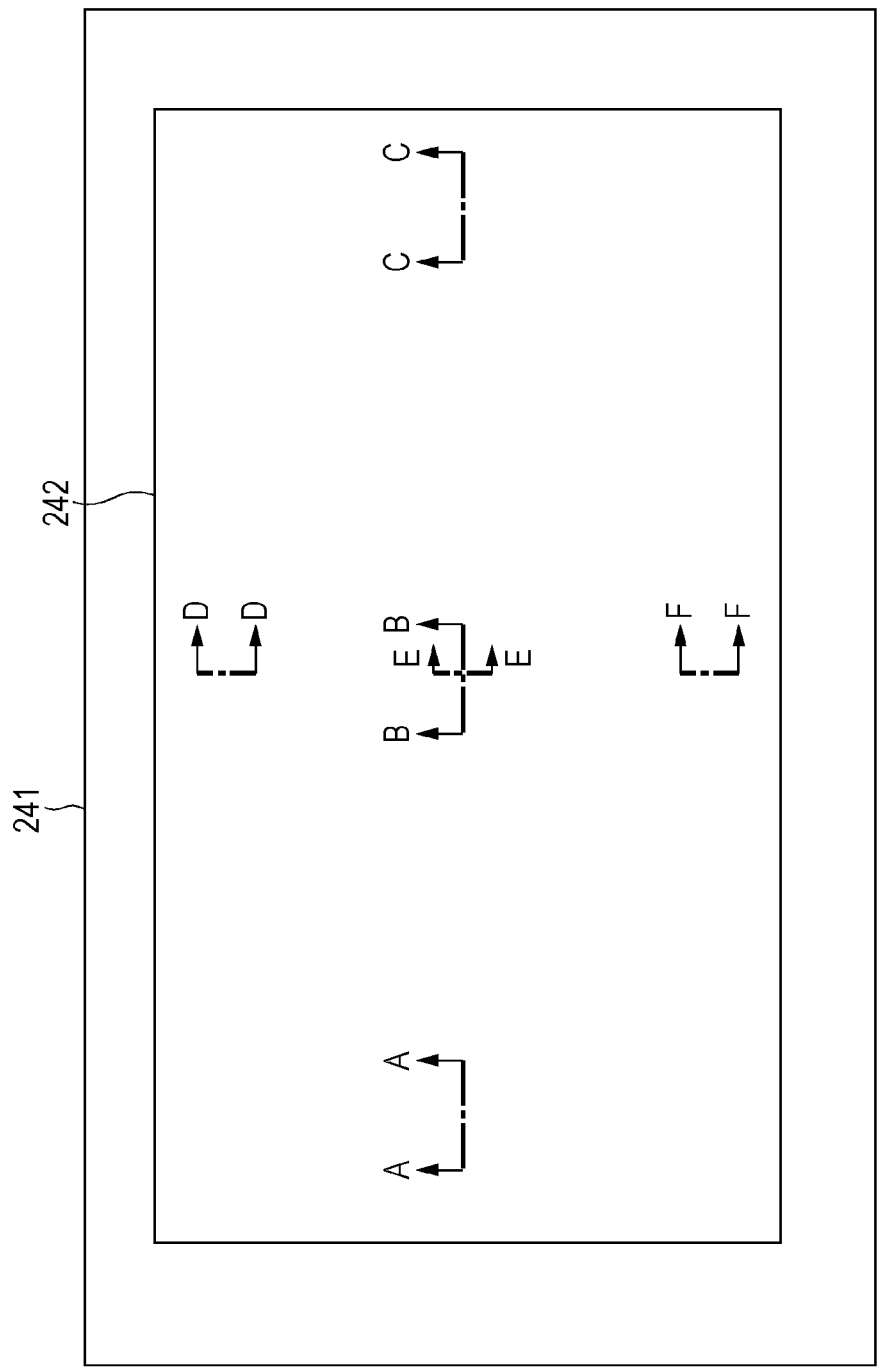
FIG. 4 illustrates positions at which pixels are placed.

FIG. 4 illustrates positions at which pixels are placed. In the example in FIG. 4, lines A-A to F-F are drawn to indicate the positions of pixels in a pixel array 242 on a semiconductor chip 241 included in a CMOS image sensor. That is, a plurality of pixels, each of which is indicated in FIG. 2 or 3, are placed in a matrix in the pixel array 242 as unit pixels.

If, for example, pixels having the layout illustrated in FIG. 2 are placed in the pixel array 242, the floating diffusion 213 in a pixel adjacent to the left side of a pixel of interest is located to the left of the photodiode 211 of the pixel of interest.

If pixels having the layout illustrated in FIG. 3 are placed in the pixel array 242, the memory 212 in a pixel adjacent to the left side of a pixel of interest is located to the left of the photodiode 211 of the pixel of interest. That is, if pixels having the layout illustrated in FIG. 3 are placed in the pixel array 242, memories 212 are located on both the right side and left side of the photodiode 211.

Figure 5:
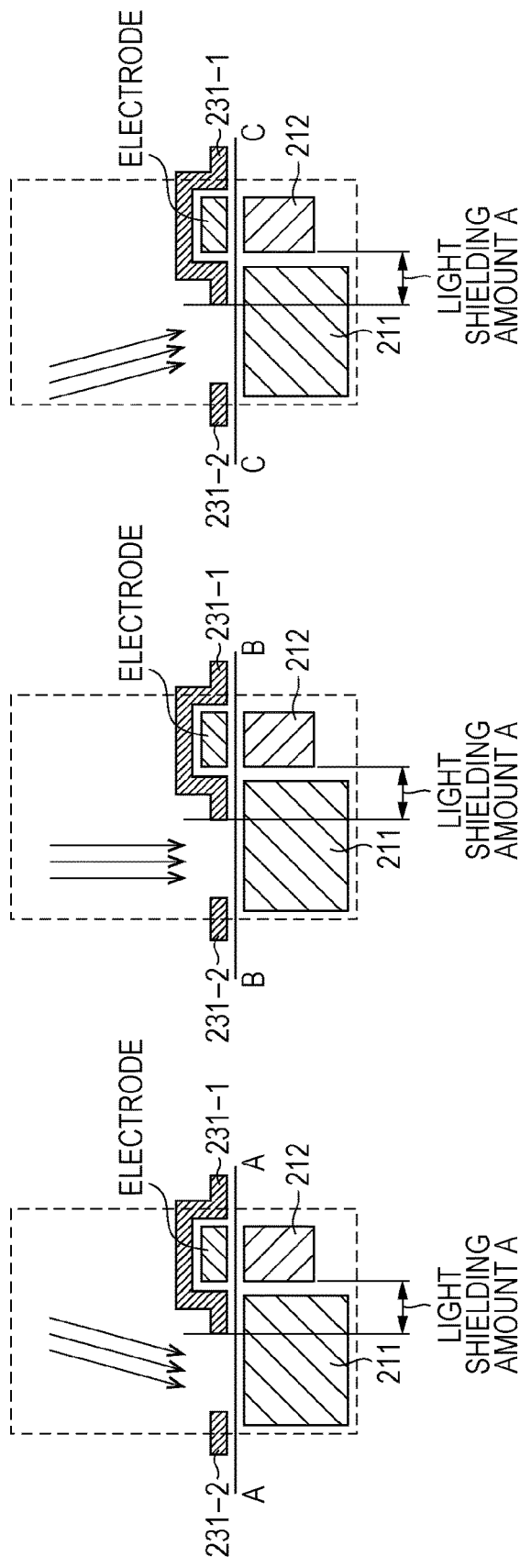
FIG. 5 is cross sectional views of pixels, as taken along line V-V in FIG. 2.

FIG. 5 is cross sectional views of pixels, as taken along line V-V in FIG. 2, specifically cross sectional views of the pixels at the positions indicated by lines A-A to C-C illustrated in FIG. 4. In FIG. 5, a rectangular portion enclosed by the dashed lines represents one pixel. Light shielding films 231-1 and 231-2 are provided on each pixel. Light is incident through an opening formed between the light shielding film 231-1 and the light shielding film 231-2. A direction in which the main light rays are directed is indicated by the three relevant arrows in FIG. 5.

Each pixel placed in the pixel array 242 is structured so that a light shielding amount A by the light shielding film 231-1 prevents part of light that has entered the pixel from leaking into the memory 212 in the pixel. The shielding amount of A is a distance indicated by the double-headed horizontal arrow in FIG. 5, specifically, a distance from the end of the memory 212 on the same side as the photodiode 211 in the pixel to the end of the light shielding film 231-1 in the pixel on the same side as the photodiode 211.

The electrode in the pixel is covered by the light shielding film 231-1.

The leftmost side in FIG. 5 illustrates a cross sectional view of the pixel at the position indicated by line A-A in FIG. 4. Since the pixel at the position indicated by line A-A is placed almost at the left end of the pixel array 242 as illustrated in FIG. 4, the main light rays of light to be received are directed downward to the left. The direction in which the main light rays are directed is indicated by the relevant arrows in FIG. 5.

The central portion in FIG. 5 illustrates a cross sectional view of the pixel at the position indicated by line B-B in FIG. 4. Since the pixel at the position indicated by line B-B is placed almost at the center of the pixel array 242 as illustrated in FIG. 4, the main light rays of light to be received are directed vertically downward. The direction in which the main light rays are directed is indicated by the relevant arrows in FIG. 5.

The rightmost side in FIG. 5 illustrates a cross sectional view of the pixel at the position indicated by line C-C in FIG. 4. Since the pixel at the position indicated by line C-C is placed almost at the right end of the pixel array 242 as illustrated in FIG. 4, the main light rays of light to be received are directed downward to the right. The direction in which the main light rays are directed is indicated by the relevant arrows in FIG. 5.

As illustrated in FIG. 5, the direction in which the main light rays are directed varies depending on the position at which the pixel is placed in the pixel array 242.

For the central pixel in FIG. 5 (pixel at the position indicated by line B-B), for example, the main light rays are directed vertically downward, so almost all of the light rays incident on the pixel are received by the photodiode 211. For the rightmost pixel in FIG. 5 (pixel at the position indicated by line C-C), however, the main light rays are directed downward to the right, so part of the light incident on the pixel may be received by the memory 212.

Each pixel placed in the pixel array 242 is structured so that the light shielding amount A by the light shielding film 231-1, which is a distance indicated by the double-headed horizontal arrow in FIG. 5, prevents part of light that has entered the pixel from leaking into the memory 212 in the pixel. For a pixel placed at an end in the pixel array 242 (pixel at the position indicated by line C-C, for example), however, the direction in which the main light rays are directed is inclined, so light that has not been shielded by the light shielding film 231-1 may enter the memory 212.

If light is received in the memory 212 as described above, after-mage noise or the like may be generated.

Figure 6:
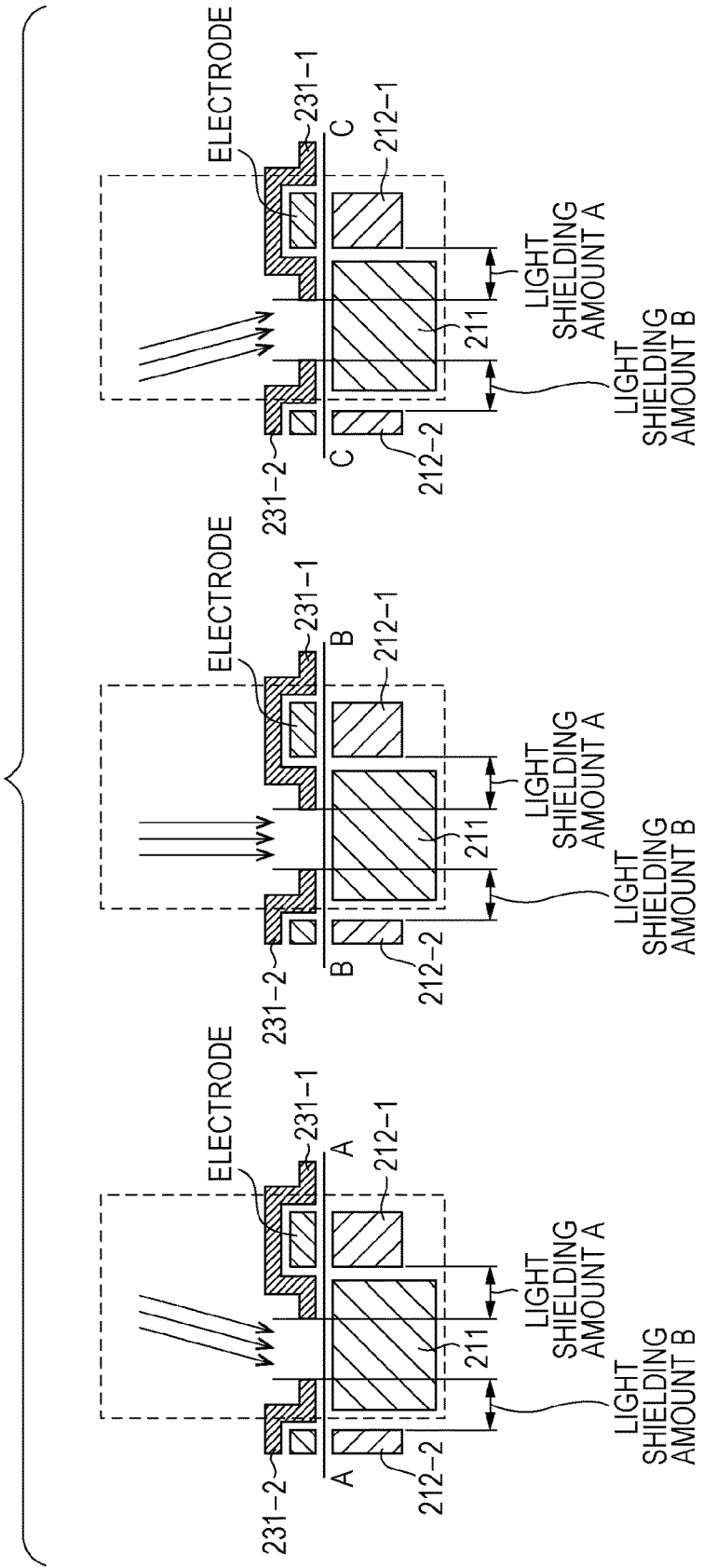
FIG. 6 is cross sectional views of pixels, as taken along line VI-VI in FIG. 3.

FIG. 6 is cross sectional views of pixels as taken along line VI-VI in FIG. 3, each of which includes part of an adjacent pixel. The cross sectional views, in FIG. 6, of the pixels at the positions indicated by lines A-A to C-C in FIG. 4 are illustrated as in FIG. 5.

In FIG. 6, a rectangular portion enclosed by the dashed lines represents one pixel; part of the pixel adjacent to the left side, on the drawing sheet, of the one pixel is illustrated. As described above, if pixels having the layout illustrated in FIG. 3 are placed in the pixel array 242, memories 212 are located on both the right side and left side of the photodiode 211.

Each pixel placed in the pixel array 242 is structured so that the light shielding amount A, which is a distance indicated by a double-headed horizontal arrow in FIG. 6, by the light shielding film 231-1 prevents part of light that has entered the pixel from leaking into the memory 212-1 in the pixel. Each pixel placed in the pixel array 242 is also structured so that a light shielding amount B, which is a distance indicated by another double-headed horizontal arrow in FIG. 6, by the light shielding film 231-2 prevents part of light that has entered the pixel from leaking into the memory 212-2 in the adjacent pixel.

The shielding amount of A is a distance from the end of the memory 212-1 in the pixel on the same side as the photodiode 211 in the pixel to the end of the light shielding film 231-1 in the pixel on the same side as the photodiode 211 in the pixel. The shielding amount of B is a distance from the end of the memory 212-2 in the adjacent pixel on the same side as the photodiode 211 in the pixel to the end of the light shielding film 231-2 in the adjacent pixel on the same side as the photodiode 211 in the pixel.

For the leftmost pixel in FIG. 6 (pixel at the position indicated by line A-A), for example, the main light rays are directed downward to the left, so part of the light incident on the pixel may be received by the memory 212-2 in the adjacent pixel.

Each pixel placed in the pixel array 242 is structured so that the light shielding amount B by the light shielding film 231-2, which is a distance indicated by the relevant double-headed horizontal arrow in FIG. 6, prevents part of light that has entered the pixel from leaking into the memory 212-2 in the adjacent pixel. For a pixel placed at an end in the pixel array 242 (pixel at the position indicated by line A-A, for example), however, the direction in which the main light rays are directed is inclined, so light that has not been shielded by the light shielding film 231-2 may enter the memory 212-2.

If light is received in the memory 212-2 in the adjacent pixel as described above, mixed color noise or the like may be generated.

As in the case described with reference to FIG. 5, each pixel placed in the pixel array 242 is structured so that the light shielding amount A by the light shielding film 231-1, which is a distance indicated by the relevant double-headed horizontal arrow in FIG. 6, prevents part of light that has entered the pixel from leaking into the memory 212-1 in the pixel. For a pixel placed at an end in the pixel array 242 (pixel at the position indicated by line C-C, for example), however, the direction in which the main light rays are directed is inclined, so light that has not been shielded by the light shielding film 231-1 may enter the memory 212-1.

If light is received in the memory 212-1 in the pixel as described above, after-image noise or the like may be generated.

Although the pixels at the positions indicated by lines A-A to C-C in FIG. 4, which are aligned linearly in a horizontal direction, have been described with reference to FIGS. 5 and 6, light may also enter the memory in a pixel adjacent to a pixel at a position indicated by line D-D or E-E in FIG. 4, the pixel and adjacent pixel being aligned linearly in the vertical direction.

Thus, in the present technology, countermeasures to shield light are taken according to the position of the pixel in the pixel array 242.

Figure 7:
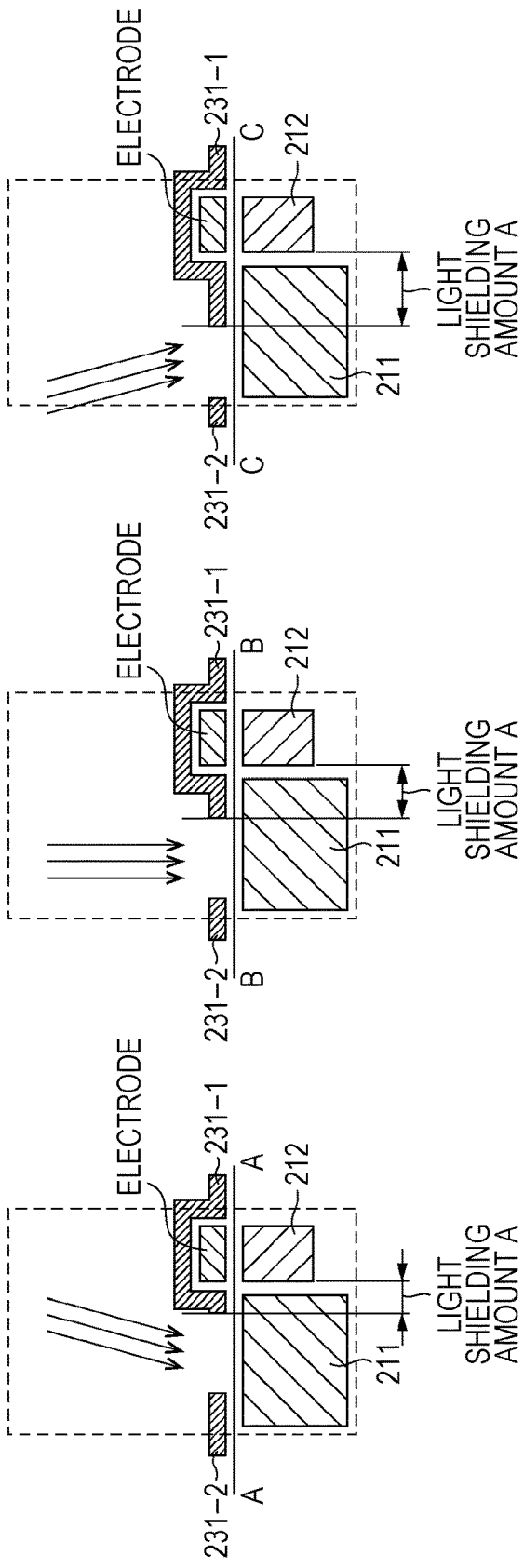
FIG. 7 is cross sectional views of pixels to which the present technology has been applied, as taken along line VII-VII in FIG. 2.

FIG. 7 is cross sectional views of pixels to which the present technology has been applied, as taken along line VII-VII in FIG. 2, specifically cross sectional views of the pixels at the positions indicated by lines A-A to C-C illustrated in FIG. 4. In FIG. 7, a rectangular portion enclosed by the dashed lines represents one pixel. The light shielding films 231-1 and 231-2 are provided on each pixel. Light is incident though an opening formed between the light shielding film 231-1 and the light shielding film 231-2. A direction in which the main light rays are directed is indicated by the three relevant arrows in FIG. 7.

The electrode in the pixel is covered by the light shielding film 231-1.

The leftmost side in FIG. 7 illustrates a cross sectional view of the pixel at the position indicated by line A-A in FIG. 4. Since the pixel at the position indicated by line A-A is placed almost at the left end of the pixel array 242 as illustrated in FIG. 4, the main light rays of light to be received are directed downward to the left. The direction in which the main light rays are directed is indicated by the relevant arrows in FIG. 7.

The central portion in FIG. 7 illustrates a cross sectional view of the pixel at the position indicated by line B-B in FIG. 4. Since the pixel at the position indicated by line B-B is placed almost at the center of the pixel array 242 as illustrated in FIG. 4, the main light rays of light to be received are directed vertically downward. The direction in which the main light rays are directed is indicated by the relevant arrows in FIG. 7.

The rightmost side in FIG. 7 illustrates a cross sectional view of the pixel at the position indicated by line C-C in FIG. 4. Since the pixel at the position indicated by line C-C is placed almost at the right end of the pixel array 242 as illustrated in FIG. 4, the main light rays of light to be received are directed downward to the right. The direction in which the main light rays are directed is indicated by the relevant arrows in FIG. 7.

The structures in FIG. 7 differ from the structures in FIG. 5 in that the light shielding amount A by the light shielding film 231-1 is varied depending on the position of the pixel.

Specifically, the light shielding amount A by the light shielding film 231-1 in the leftmost pixel in FIG. 7 (pixel at the position indicated by line A-A) is smaller than that in the central pixel in FIG. 7 (pixel at the position indicated by line B-B). Conversely, the light shielding amount A by the light shielding film 231-1 in the rightmost pixel in FIG. 7 (pixel at the position indicated by line C-C) is larger than that in the central pixel in FIG. 7 (pixel at the position indicated by line B-B).

In the pixel, in FIG. 7, at the position indicated by line C-C, the left end, on the drawing sheet, of the light shielding film 231-1 is prolonged along the top surface of the photodiode 211. Accordingly, even if the main light rays of light to be received are inclined, it is possible to prevent light from leaking into the memory 212.

To have the size of the opening formed between the light shielding film 231-1 and the light shielding film 231-2 remain unchanged in the pixel, in FIG. 7, at the position indicated by line A-A, the right end, on the drawing sheet, of the light shielding film 231-2 is prolonged along the top surface of the photodiode 211; in the pixel, in FIG. 7, at the position indicated by line C-C, the right end, on the drawing sheet, of the light shielding film 231-2 is shortened.

Figure 8:
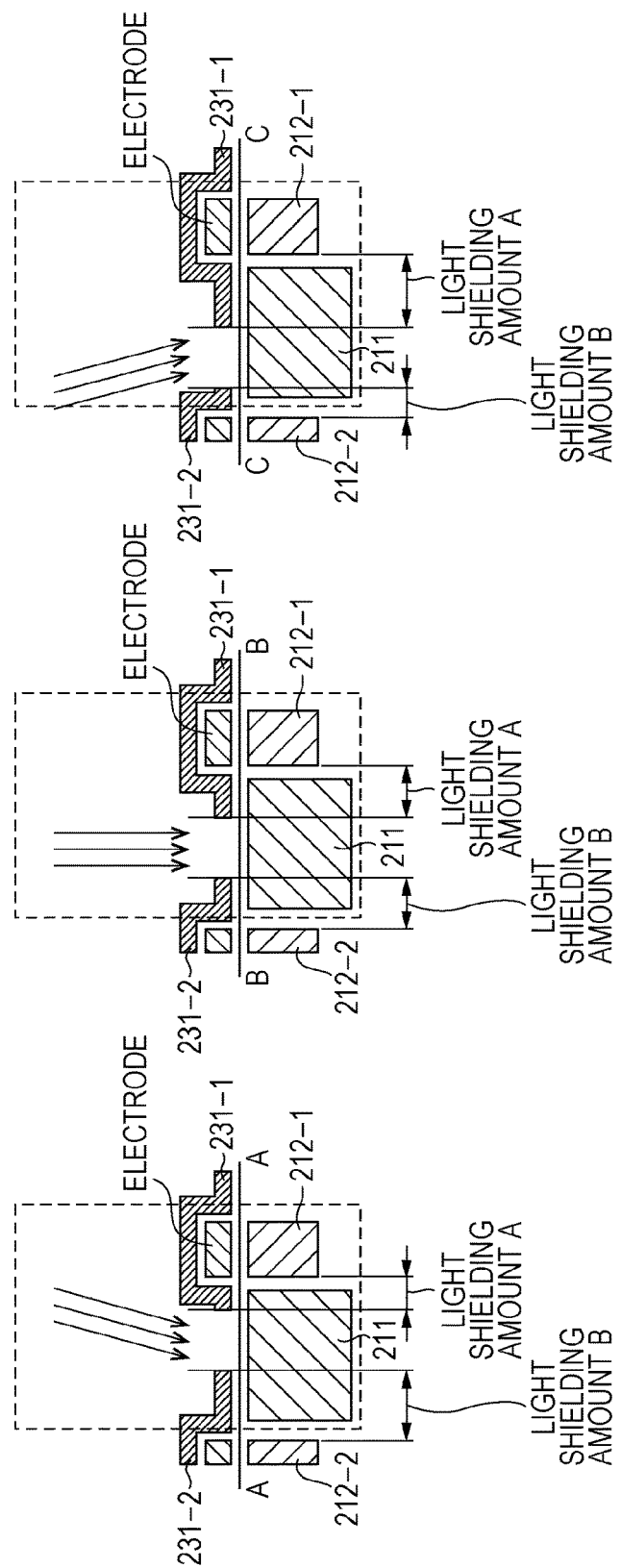
FIG. 8 is cross sectional views of pixels to which the present technology has been applied, as taken along line VIII-VIII in FIG. 3.

FIG. 8 is cross sectional views of pixels to which the present technology has been applied, as taken along line VIII-VIII in FIG. 3, each of which includes part of an adjacent pixel. The cross sectional views, in FIG. 8, of the pixels at the positions indicated by lines A-A to C-C in FIG. 4 are illustrated as in FIG. 6.

In FIG. 8, a rectangular portion enclosed by the dashed lines represents one pixel; part of the pixel adjacent to the left side, on the drawing sheet, of the one pixel is illustrated. As described above, if pixels having the layout illustrated in FIG. 3 are placed in the pixel array 242, memories 212 are located on both the right side and left side of the photodiode 211.

The leftmost side in FIG. 8 illustrates a cross sectional view of the pixel at the position indicated by line A-A in FIG. 4. Since the pixel at the position indicated by line A-A is placed almost at the left end of the pixel array 242 as illustrated in FIG. 4, the main light rays of light to be received are directed downward to the left. The direction in which the main light rays are directed is indicated by the relevant arrows in FIG. 8.

The central portion in FIG. 8 illustrates a cross sectional view of the pixel at the position indicated by line B-B in FIG. 4. Since the pixel at the position indicated by line B-B is placed almost at the center of the pixel array 242 as illustrated in FIG. 4, the main light rays of light to be received are directed vertically downward. The direction in which the main light rays are directed is indicated by the relevant arrows in FIG. 8.

The rightmost side in FIG. 8 illustrates a cross sectional view of the pixel at the position indicated by line C-C in FIG. 4. Since the pixel at the position indicated by line C-C is placed almost at the right end of the pixel array 242 as illustrated in FIG. 4, the main light rays of light to be received are directed downward to the right. The direction in which the main light rays are directed is indicated by the relevant arrows in FIG. 8.

The structures in FIG. 8 differ from the structures in FIG. 6 in that the light shielding amount A by the light shielding film 231-1 and the light shielding amount B by the light shielding film 231-2 are varied depending on the position of the pixel.

Specifically, the light shielding amount A by the light shielding film 231-1 in the leftmost pixel in FIG. 8 (pixel at the position indicated by line A-A) is smaller than that in the central pixel in FIG. 8 (pixel at the position indicated by line B-B). Conversely, the light shielding amount A by the light shielding film 231-1 in the rightmost pixel in FIG. 8 (pixel at the position indicated by line C-C) is larger than that in the central pixel in FIG. 8 (pixel at the position indicated by line B-B).

The light shielding amount B by the light shielding film 231-2 in the leftmost pixel in FIG. 8 (pixel at the position indicated by line A-A) is larger than that in the central pixel in FIG. 8 (pixel at the position indicated by line B-B). Conversely, the light shielding amount B by the light shielding film 231-2 in the rightmost pixel in FIG. 8 (pixel at the position indicated by line C-C) is smaller than that in the central pixel in FIG. 8 (pixel at the position indicated by line B-B).

In the pixel, in FIG. 8, at the position indicated by line A-A, the right end, on the drawing sheet, of the light shielding film 231-2 is prolonged along the top surface of the photodiode 211. Accordingly, even if the main light rays of light to be received are inclined, it is possible to prevent light from leaking into the memory 212-2. This is also true for the pixel, in FIG. 8, at the position indicated by line C-C; the left end, on the drawing sheet, of the light shielding film 231-1 is prolonged along the top surface of the photodiode 211, so even if the main light rays of light to be received are inclined, it is possible to prevent light from leaking into the memory 212-1.

Although the pixels at the positions indicated by lines A-A to C-C in FIG. 4, which are aligned linearly in a horizontal direction, have been described with reference to FIGS. 7 and 8, countermeasures to shield light are also taken for the pixels aligned linearly in the vertical direction at the positions indicated by line D-D and E-E in FIG. 4, according to the position of the pixel in the pixel array 242. Specifically, although the shape, in a horizontal direction, of the light shielding film of the pixels at the positions indicated by lines A-A to C-C has been changed according to the position of the pixel, the pixels at the positions indicated by lines D-D and E-E may be structured so that the shape, in the vertical direction, of the light shielding film is changed according to the position of the pixel.

According to the present technology, the light shielding amount has been changed according to the position of the pixel in the pixel array 242 as described above, so it possible to prevent light form entering the memory and thereby to suppress occurrence of after-image noise, mixed color noise, and the like.

Although, in the embodiment described above, an example in which the light shielding films are used to change the light shielding amount, by which light is shielded by, has been described, wires formed in wire layers formed on a silicon layer in which a sensor is formed may be used in an image sensor chip, instead of the light shielding films.

Figure 9:
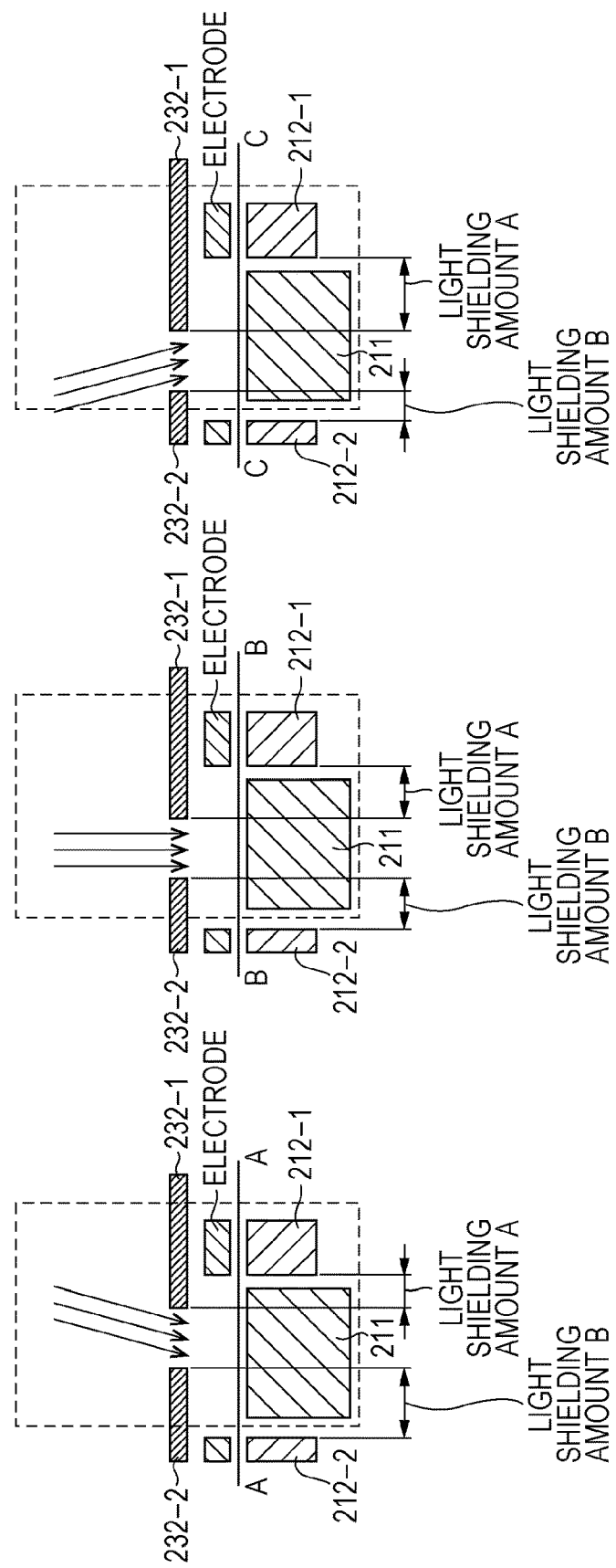
FIG. 9 is cross sectional views of another example of pixels to which the present technology has been applied, as taken along line IX-IX in FIG. 3.

FIG. 9 is cross sectional views of another example of pixels to which the present technology has been applied, as taken along line IX-IX in FIG. 3, which includes part of an adjacent pixel. The cross sectional views, in FIG. 9, of the pixels at the positions indicated by lines A-A to C-C in FIG. 4 are illustrated as in FIG. 8.

In FIG. 9, a rectangular portion enclosed by the dashed lines represents one pixel; part of the pixel adjacent to the left side, on the drawing sheet, of the one pixel is illustrated. As described above, if pixels having the layout illustrated in FIG. 3 are placed in the pixel array 242, memories 212 are located on both the right side and left side of the photodiode 211.

The structures in FIG. 9 differ from the structures in FIG. 8 in that a wire 232-1 and a wire 232-2 are provided on the pixel. Light is incident through an opening formed between the wire 232-1 and the wire 232-2. A direction in which the main light rays are directed is indicated by the three relevant arrows in FIG. 9.

In the structure illustrated in FIG. 9, the light shielding amount A by the wire 232-1 and the light shielding amount B by the wire 232-2 are varied depending on the position of the pixel.

Specifically, the light shielding amount A by the wire 232-1 in the leftmost pixel in FIG. 9 (pixel at the position indicated by line A-A) is smaller than that in the central pixel in FIG. 9 (pixel at the position indicated by line B-B). Conversely, the light shielding amount A by the wire 232-1 in the rightmost pixel in FIG. 9 (pixel at the position indicated by line C-C) is larger than that in the central pixel in FIG. 9 (pixel at the position indicated by line B-B).

The light shielding amount B by the wire 232-2 in the leftmost pixel in FIG. 9 (pixel at the position indicated by line A-A) is larger than that in the central pixel in FIG. 9 (pixel at the position indicated by line B-B). Conversely, the light shielding amount B by the wire 232-2 in the rightmost pixel in FIG. 9 (pixel at the position indicated by line C-C) is smaller than that in the central pixel in FIG. 9 (pixel at the position indicated by line B-B).

In the pixel, in FIG. 9, at the position indicated by line A-A, the right end, on the drawing sheet, of the wire 232-2 is prolonged along the top surface of the photodiode 211. Accordingly, even if the main light rays of light to be received are inclined, it is possible to prevent light from leaking into the memory 212-2. This is also true for the pixel, in FIG. 9, at the position indicated by line C-C; the left end, on the drawing sheet, of the wire 232-1 is prolonged along the top surface of the photodiode 211, so even if the main light rays of light to be received are inclined, it is possible to prevent light from leaking into the memory 212-1.

Although examples in which, in the structures in FIGS. 7 to 9, the size of the opening formed between the light shielding film 231-1 and the light shielding film 231-2 (or between the wire 232-1 and the wire 232-2) remains unchanged regardless of the position of the pixel has been described, the size of the opening may be varied depending on the position of the pixel.

Figure 10:
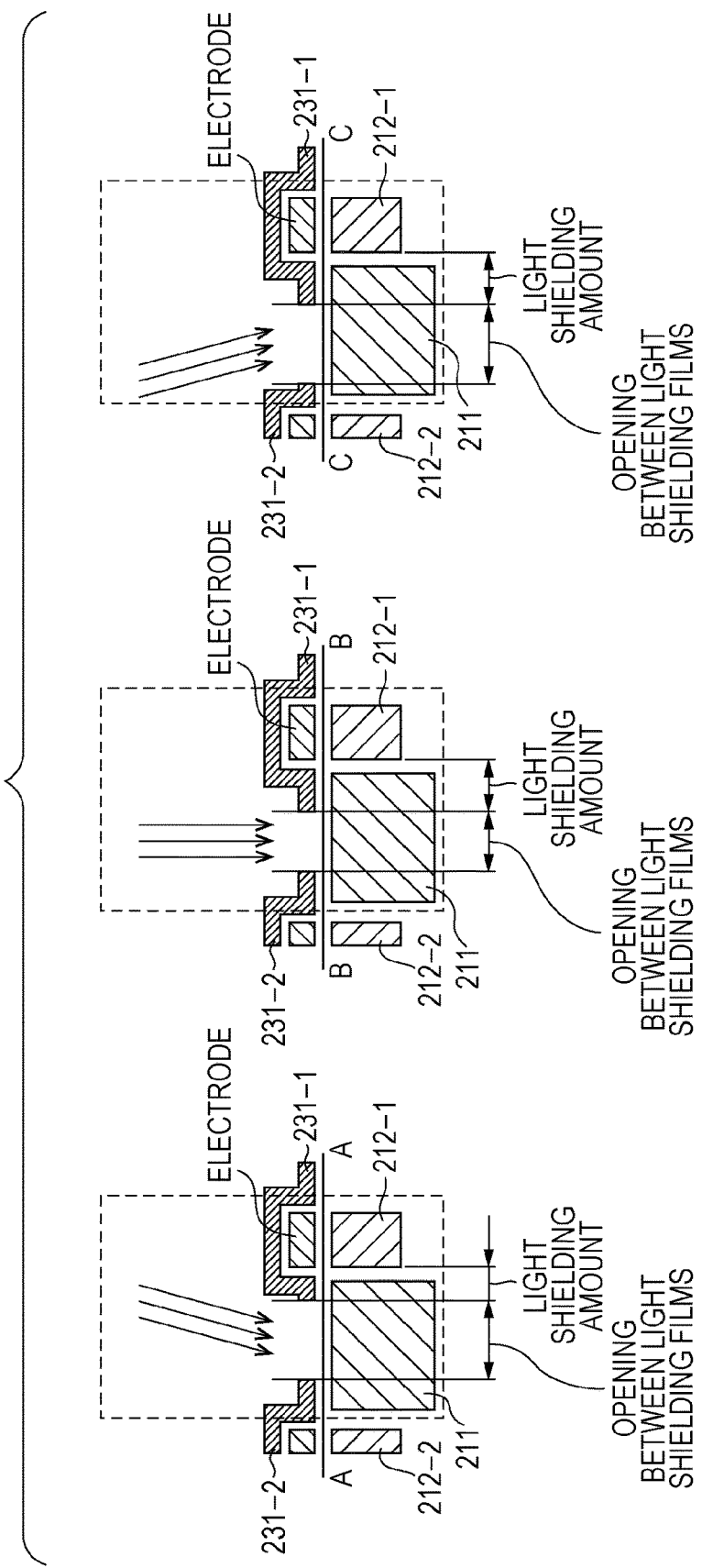
FIG. 10 is cross sectional views of yet another example of pixels to which the present technology has been applied, as taken along line X-X in FIG. 3.

FIG. 10 is cross sectional views of yet another example of pixels to which the present technology has been applied, as taken along line X-X in FIG. 3, which includes part of an adjacent pixel. The cross sectional views, in FIG. 10, of the pixels at the positions indicated by lines A-A to C-C in FIG. 4 are illustrated as in FIG. 8.

In FIG. 10, a rectangular portion enclosed by the dashed lines represents one pixel; part of the pixel adjacent to the left side, on the drawing sheet, of the one pixel is illustrated. As described above, if pixels having the layout illustrated in FIG. 3 are placed in the pixel array 242, memories 212 are located on both the right side and left side of the photodiode 211.

The structures in FIG. 10 differ from the structures in FIGS. 7 to 9 in that the size of the opening formed between the light shielding film 231-1 and the light shielding film 231-2 is varied depending on the position of the pixel.

Specifically, in the structures illustrated in FIG. 10, the size of the opening in the leftmost pixel in FIG. 10 (pixel at the position indicated by line A-A) and in the rightmost pixel in FIG. 10 (pixel at the position indicated by line C-C) is larger than that in the central pixel in FIG. 10 (pixel at the position indicated by line B-B).

In the pixel, in FIG. 10, at the position indicated by line B-B, the opening is formed at the center of the photodiode 211. By comparison, in the pixel, in FIG. 10, at the position indicated by line A-A, the opening is formed to the right the center of the photodiode 211, and in the pixel, in FIG. 10, at the position indicated by line C-C, the opening is formed to the left the center of the photodiode 211.

Relatively bright light is incident on a pixel placed near the center of the pixel array 242 (pixel at the position indicated by line B-B, for example). Even if the opening in the pixel is small in size, therefore, a pixel signal is not so affected. However, relative weak light is incident on a pixel placed in the peripheral portion of the pixel array 242 (pixel at the position indicated by lines A-A or C-C, for example). If the opening in the pixel is small in size, therefore, the pixel signal is greatly affected. Accordingly, in FIG. 10, the pixel at the position indicated by line B-B has a small opening and the pixels at the positions indicated by lines A-A and C-C have a large opening.

Since the size of the opening is adjusted in this way according to the position of the pixel, shading can be improved.

In the pixels at the position indicated by lines A-A and C-C, the opening is shifted from the center of the photodiode 211. Accordingly, even if the main light rays of light to be received are inclined, it is possible to prevent light from leaking into the memory 212-1 or memory 212-2.

In the above embodiment, it has been described that even if the main light rays of light to be received are inclined, leak of light into the memory can be prevented. In some CMOS image sensors, the floating diffusion functions like a memory. In this case, it suffices to change the shape of the light shielding film or wire to prevent light from leaking into the floating diffusion even if the main light rays of light to be received are inclined.

Although, in the above embodiment, an example in which the present technology is applied to a CMOS image sensor has been described, the present technology may be applied to, for example, a charge-coupled device (CCD) image sensor. A charge transfer path in a CCD image sensor is equivalent to a memory in a CMOS image sensor. To prevent light from leaking into the charge transfer path even if the main light rays of light to be received are inclined, therefore, the shape of the light shielding film or wire, for example, may be varied.

Figure 11:
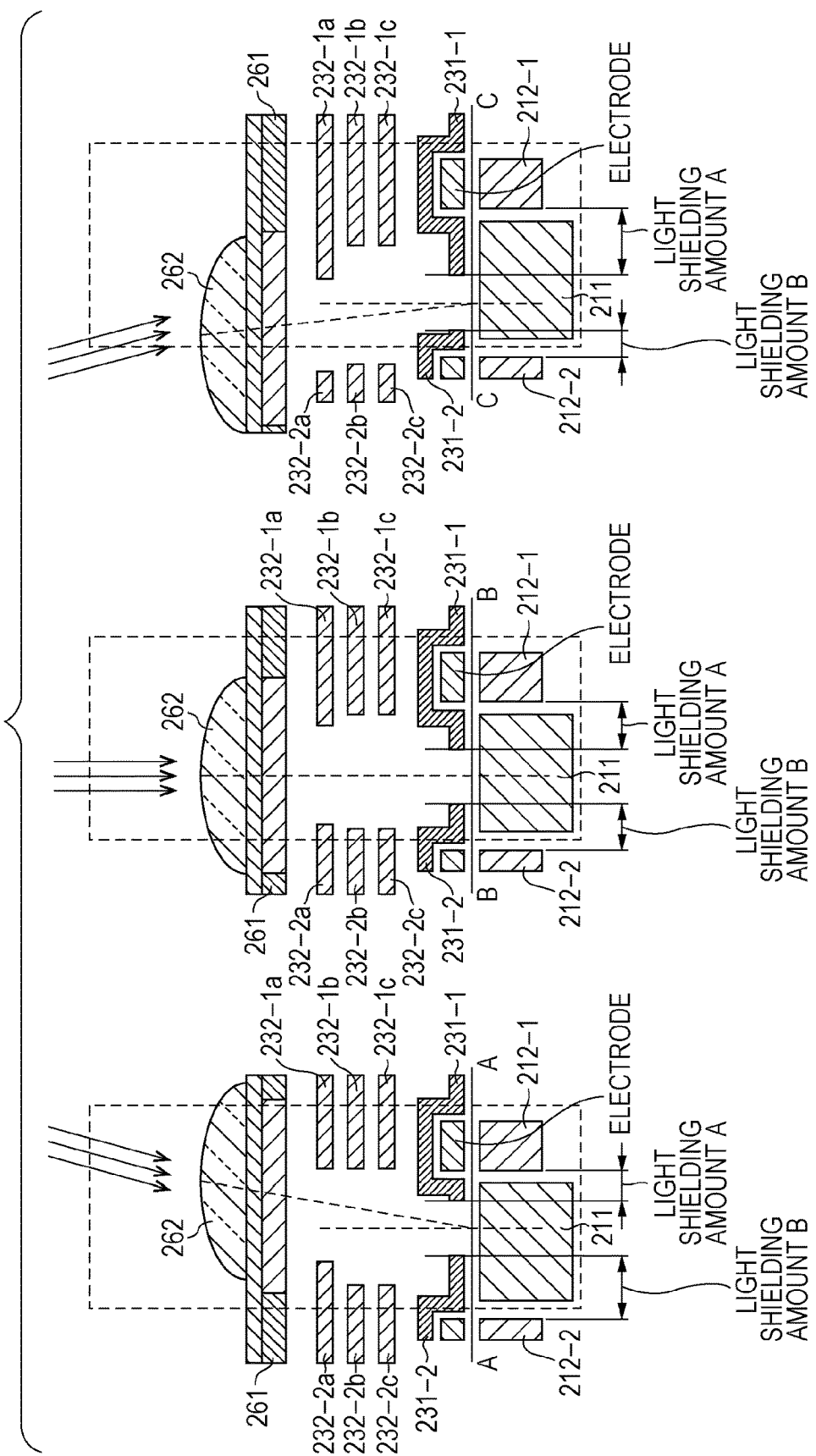
FIG. 11 is cross sectional views of still another example of pixels to which the present technology has been applied, as taken along line XI-XI in FIG. 3.

FIG. 11 is cross sectional views of still another example of pixels to which the present technology has been applied, as taken along line XI-XI in FIG. 3, which includes part of an adjacent pixel. In the example in FIG. 11, a structure is illustrated in which a color filter and an on-chip lens are placed on a chip of an image sensor having a plurality of wire layers.

The structure in FIG. 11 has three-wire layers; wires 232-1a to 232-1c are provided on the right side on the drawing sheet and wires 232-2a to 232-2c are provided on the left side on the drawing sheet. In the structure in FIG. 11, a color filter 261 is formed on the wire layers and an on-chip lens 262 is formed on the color filter 261.

The cross sectional views in FIG. 11 illustrate the cross sections of the pixels at the positions indicated by lines A-A to C-C in FIG. 4. In FIG. 11, a rectangular portion enclosed by the dashed lines represents one pixel. Light passes through the on-chip lens 262 and color filter 261 and enters the photodiode 211 through an opening formed between the wires 232-1a to 232-1c and the wires 232-2a to 232-2c and through an opening formed between the light shielding film 231-1 and the light shielding film 231-2. A direction in which the main light rays are directed is indicated by the three relevant arrows in FIG. 11.

In the structure illustrated in FIG. 11, the light shielding amount A by the light shielding film 231-1 and the light shielding amount B by the light shielding film 231-2 are varied depending on the position of the pixel.

Specifically, the light shielding amount A by the light shielding film 231-1 in the leftmost pixel in FIG. 11 (pixel at the position indicated by line A-A) is smaller than that in the central pixel in FIG. 11 (pixel at the position indicated by line B-B). Conversely, the light shielding amount A by the light shielding film 231-1 in the rightmost pixel in FIG. 11 (pixel at the position indicated by line C-C) is larger than that in the central pixel in FIG. 11 (pixel at the position indicated by line B-B).

The light shielding amount B by the light shielding film 231-2 in the leftmost pixel in FIG. 11 (pixel at the position indicated by line A-A) is larger than that in the central pixel in FIG. 11 (pixel at the position indicated by line B-B). Conversely, the light shielding amount B by the light shielding film 231-2 in the rightmost pixel in FIG. 11 pixel at the position indicated by line C-C) is smaller than that in the central pixel in FIG. 11 pixel at the position indicated by line B-B).

In the structure illustrated in FIG. 11, the shapes of the wires 232-1a to 232-1c and the wires 232-2a to 232-2c are varied depending on the position of the pixel. Particularly, the shapes of the wires 232-1a and 232-2a are varied depending on the position of the pixel.

Specifically, in the pixel at the position indicated by line A-A in FIG. 11, the wire 232-2a is prolonged toward the right side on the drawing sheet and the wire 232-1a is shortened on the left side on the drawing sheet, when compared with the pixel at the position indicated by line B-B. Conversely, in the pixel at the position indicated by line C-C in FIG. 11, the wire 232-2a is shortened on the right side on the drawing sheet and the wire 232-1a is prolonged toward the left side on the drawing sheet, when compared with the pixel at the position indicated by line B-B.

In the pixel, in FIG. 11, at the position indicated by line A-A, the right end, on the drawing sheet, of the light shielding film 231-2 is prolonged along the top surface of the photodiode 211. Accordingly, even if the main light rays of light to be received are inclined, it is possible to prevent light from leaking into the memory 212-2. This is also true for the pixel, in FIG. 11, at the position indicated by line C-C; the left end, on the drawing sheet, of the light shielding film 231-1 is prolonged along the top surface of the photodiode 211, so even if the main light rays of light to be received are inclined, it is possible to prevent light from leaking into the memory 212-1.

Furthermore, in the pixel, in FIG. 11, at the position indicated by line A-A, the right end, on the drawing sheet, of the wire 232-2a is prolonged along the top surface of the photodiode 211. Accordingly, even if the main light rays of light to be received are inclined, it is possible to prevent light from leaking into the memory 212-2. This is also true for the pixel, in FIG. 11, at the position indicated by line C-C; the left end, on the drawing sheet, of the wire 232-1a is prolonged along the top surface of the photodiode 211, so even if the main light rays of light to be received are inclined, it is possible to prevent light from leaking into the memory 212-1.

Furthermore, in the structure illustrated in FIG. 11, the position at which the on-chip lens 262 is placed is varied depending on the position of the pixel.

Specifically, the on-chip lens 262 of the pixel at the position indicated by line A-A in FIG. 11 is placed on the right side on the drawing sheet with respect to the on-chip lens 262 of the pixel at the position indicated by line B-B, according to the direction in which the main light rays are directed. Similarly, the on-chip lens 262 of the pixel at the position indicated by line C-C in FIG. 11 is placed on the left side on the drawing sheet with respect to the on-chip lens 262 of the pixel at the position indicated by line B-B, according to the direction in which the main light rays are directed.

Thus, in the pixel at each position, light that has passed through the on-chip lens 262 and color filter 261 can be directed to the photodiode 211 through the opening formed between the wires 232-1a to 232-1c and the wires 232-2a to 232-2c and through the opening formed between the light shielding film 231-1 and the light shielding film 231-2, as indicated by the relevant dashed line.

Accordingly, the present technology can prevent light from leaking into a memory in a pixel or its adjacent pixel regardless of the position of the pixel in the pixel array. As a result, it is possible to suppress mixed color noise or after-image noise, improving the pixel characteristics.

If the present technology is combined with layout correction for the wire layers, color filter, and on-chip lens, it becomes possible to suppress optical noise without impairing sensitivity, shading and other basic optical characteristics. If the size of the opening formed between the light shielding films is varied in the chip, improvement in shading can be expected.

The present technology is not limited to applications to solid-state imaging devices such as image sensors. The present technology can also be applied to imaging devices such as digital still cameras and video cameras, mobile telephone terminals having imaging functions, copiers that use a solid-state imaging device in an image read unit, and other general electronic devices that use a solid-state imaging device in an image capturing unit (photoelectric converting unit).

Figure 12:
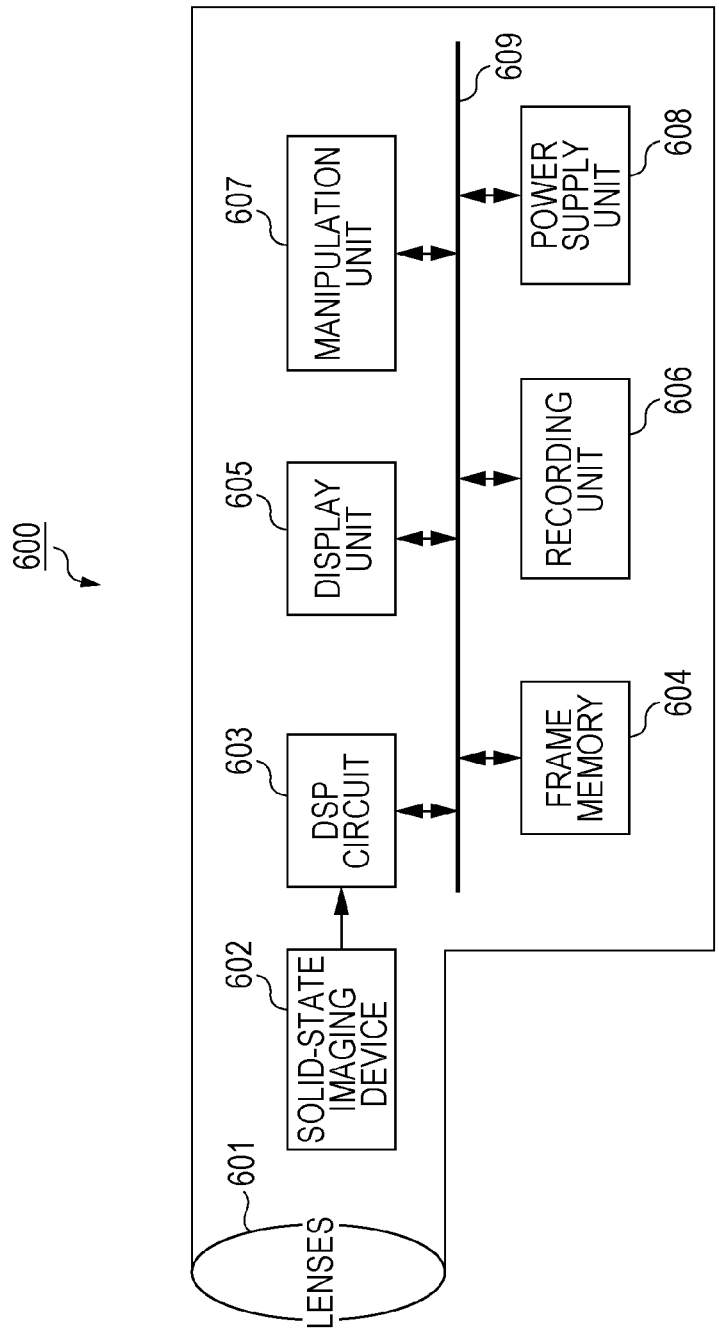
FIG. 12 is a block diagram illustrating an example of the structure of a camera apparatus used as an electronic device to which the present technology has been applied.

FIG. 12 is a block diagram illustrating an example of the structure of a camera apparatus used as an electronic device to which the present technology has been applied.

The camera apparatus 600 in FIG. 12 includes an optical unit 601 constituted by lenses, a solid-state imaging device 602, and a digital signal processing (DSP) circuit 603, which is a camera signal processing circuit. The camera apparatus 600 also includes a frame memory 604, a display unit 605, a recording unit 606, a manipulation unit 607, and a power supply unit 608. The DSP circuit 603, frame memory 604, display unit 605, recording unit 606, manipulation unit 607, and power supply unit 608 are mutually connected through a bus line 609.

The optical unit 601 receives incident light (image light) directed from a subject and focuses the received light onto the imaging surface of the solid-state imaging device 602. The solid-state imaging device 602 converts the amount of incident light focused onto the imaging surface by the optical unit 601 to an electric signal, and outputs the electric signal as a pixel signal. A solid-state imaging device such as an image sensor that uses the pixel in the above embodiment can be used as the solid-state imaging device 602.

The display unit 605 is a panel display unit that uses a panel such as, for example, a liquid crystal panel or an electro luminescence (EL) panel. The display unit 605 displays a moving picture or still picture captured by the solid-state imaging device 602. The recording unit 606 records the moving picture or still picture captured by the solid-state imaging device 602 on a video tape, a digital versatile disk (DVD) or another recording medium.

The manipulation unit 607 issues manipulation commands for various functions of the camera apparatus 600 according to manipulations made by the user. The power supply unit 608 supplies various types of electric power, on which the DSP circuit 603, frame memory 604, display unit 605, recording unit 606, and manipulation unit 607 operate, to them at appropriate times.

Applications of the present technology are not limited to solid-state imaging devices that detect a distribution of incident light amounts of visible light and capture the distribution as an image. The present technology can also be applied to general solid-state devices that detect a distribution of incident amounts of infra-red rays, X-rays, or particles and capture the distribution as an image, and, in a broad sense, to general electronic devices (physical quantity distribution detecting devices) such as fingerprint detecting sensors that detect a distribution of pressure, capacitances, or other physical quantities and capture the distribution as an image.

A series of processing described above in this description includes not only processing that is performed in time series in the order of the description but also processing that is not necessarily performed in time series but is performed concurrently or individually.

The present technology is not limited to the embodiment described above. Various modifications are possible without departing from the spirit and scope of the present technology.

The present technology can also have structures described below.

(1) An image sensor that includes
a plurality of unit pixels formed as a semiconductor chip, each of which has
a photoelectric converting unit,
a charge holding unit that holds charges stored in the photoelectric converting unit,
a charge-voltage converting unit that converts a charge transferred from the charge holding unit to a voltage, and
light shielding films between which an opening is formed above the photoelectric converting unit;
the plurality of unit pixels are placed in a matrix in a pixel array;
the shapes of the light shielding films are varied depending on the position of the unit pixel in the pixel array.

(2) The image sensor described in (1) above in which, at each position of the unit pixel in the pixel array, the shapes of the light shielding films are determined according to the direction in which the main light rays of light incident on the photoelectric converting unit are directed.

(3) The image sensor described in (1) or (2) above in which the position of the opening formed between the light shielding films is varied depending on the position of the unit pixel in the pixel array.

(4) The image sensor described in (3) above in which wires of the semiconductor chip are used instead of the light shielding films.

(5) The image sensor described in any one of (1) to (3) above in which the size of the opening formed between the light shielding films is varied depending on the position of the unit pixel in the pixel array.

(6) The image sensor described in any one of (1) to (3) above in which the shapes of the wires of the semiconductor chip are further varied depending on the position of the unit pixel in the pixel array.

(7) The image sensor described in (6) above in which, at each position of the unit pixel in the pixel array, the shapes of the light shielding films and the shapes of the wires of the semiconductor chip are determined according to the direction in which the main light rays of light incident on the photoelectric converting unit are directed and a position at which the on-chip lens of the unit pixel is placed is further varied depending on the direction of the main light rays.

(8) An electronic device having an image sensor that includes a plurality of unit pixels formed as a semiconductor chip, each of which has
a photoelectric converting unit,
a charge holding unit that holds charges stored in the photoelectric converting unit,
a charge-voltage converting unit that converts a charge transferred from the charge holding unit to a voltage, and
light shielding films between which an opening is formed above the photoelectric converting unit;
the plurality of unit pixels are placed in a matrix in a pixel array;
the shapes of the light shielding films are varied depending on the position of the unit pixel in the pixel array.

It should be understood by those skilled in the art that various modifications, combinations, sub-combinations and alterations may occur depending on design requirements and other factors insofar as they are within the scope of the appended claims or the equivalents thereof.

What is claimed is:

1. An image sensor, comprising:
a semiconductor chip, wherein the semiconductor chip comprises:
a plurality of unit pixels in a pixel array, wherein a unit pixel of the plurality of unit pixels comprises:
a photoelectric converting unit configured to store charges;
a charge holding unit configured to hold the charges stored in the photoelectric converting unit;
a charge-voltage converting unit configured to convert the charges to a voltage; and
a plurality of light shielding films, wherein
an opening is between a first end of a first light shielding film of the plurality of light shielding films and a second end of a second light shielding film of the plurality of light shielding films,
the first light shielding film and the second light shielding film are on at least a portion of the photoelectric converting unit,
a distance between an end of the charge holding unit and the first end of the first light shielding film of the unit pixel is different from a corresponding distance of a different unit pixel based on positions of the unit pixel and the different unit pixel in the pixel array, such that the first end of the first light shielding film and the second end of the second light shielding film remain on the at least the portion of the photoelectric converting unit, and the charge holding unit and the first light shielding film are on a same side of the photoelectric converting unit.

2. The image sensor according to claim 1, wherein a position of the opening is based on a position of the unit pixel in the pixel array.

3. The image sensor according to claim 1, wherein the semiconductor chip further comprises a plurality of wires on the plurality of unit pixels.

4. The image sensor according to claim 3, wherein shapes of the plurality of wires on the plurality of unit pixels are based on a position of the unit pixel in the pixel array.

5. The image sensor according to claim 1, wherein the semiconductor chip further comprises:
a plurality of wires on the plurality of light shielding films at a position of each unit pixel of the plurality of unit pixels in the pixel array; and
an on-chip lens on each of the plurality of wires,
wherein shapes of the plurality of light shielding films and shapes of the plurality of wires are based on a direction of light rays incident on the photoelectric converting unit and a position of the on-chip lens, and
wherein the position of the on-chip lens is based on the direction of the light rays.

6. The image sensor according to claim 1,
wherein a first size of the opening of a first unit pixel of the plurality of unit pixels is smaller than a second size of the opening of a second unit pixel of the plurality of unit pixels, and
wherein the first unit pixel is at a center of the pixel array and the second unit pixel is away from the center of the pixel array.

7. An electronic device, comprising:
an image sensor, wherein the image sensor comprises:
a semiconductor chip, wherein the semiconductor chip comprises:
a plurality of unit pixels in a pixel array, wherein a unit pixel of the plurality of unit pixels comprises:
a photoelectric converting unit configured to store charges;
a charge holding unit configured to hold the charges stored in the photoelectric converting unit;
a charge-voltage converting unit configured to convert the charges to a voltage; and
a plurality of light shielding films, wherein
an opening is between a first end of a first light shielding film of the plurality of light shielding films and a second end of a second light shielding film of the plurality of light shielding films,
the first light shielding film and the second light shielding film are on at least a portion of the photoelectric converting unit,
a distance between an end of the charge holding unit and the first end of the first light shielding film of the unit pixel is different from a corresponding distance of a different unit pixel based on positions of the unit pixel and the different unit pixel in the pixel array, such that the first end of the first light shielding film and the second end of the second light shielding film remain on the at least the portion of the photoelectric converting unit, and the charge holding unit and the first light shielding film are on same side of the photoelectric converting unit.

\* \* \* \* \*